(12) United States Patent
Moronval et al.

(10) Patent No.: US 9,509,252 B2
(45) Date of Patent: Nov. 29, 2016

(54) DOHERTY AMPLIFIER

(71) Applicant: Ampleon Netherlands B.V., Nijmegen (NL)

(72) Inventors: Xavier Moronval, Colomiers (FR); Gerard Jean-Louis Bouisse, Toulouse (FR); Jean-Jacques Bouny, Fontenilles (FR)

(73) Assignee: Ampleon Netherlands B.V., Nijmegen (NL)

(*) Notice: Subject to any disclaimer, the term of this patent is extended or adjusted under 35 U.S.C. 154(b) by 0 days.

(21) Appl. No.: 14/526,069

(22) Filed: Oct. 28, 2014

(65) Prior Publication Data

US 2015/0145601 A1    May 28, 2015

(30) Foreign Application Priority Data

Nov. 22, 2013   (EP) .................................... 13290292

(51) Int. Cl.
| | | |
|---|---|---|
| H03F 1/02 | (2006.01) | |
| H03F 3/21 | (2006.01) | |
| H03F 3/68 | (2006.01) | |
| H03F 1/07 | (2006.01) | |

(52) U.S. Cl.
CPC .............. *H03F 1/0288* (2013.01); *H03F 1/07* (2013.01); *H03F 3/211* (2013.01); *H03F 2200/267* (2013.01); *H03F 2203/21106* (2013.01)

(58) Field of Classification Search
USPC .................... 330/295, 124 R, 84, 286, 53–54
See application file for complete search history.

(56) References Cited

U.S. PATENT DOCUMENTS

| | | | |
|---|---|---|---|
| 5,270,663 A | 12/1993 | Sano et al. | |
| 7,688,135 B2 * | 3/2010 | Kim ...................... | H03F 1/0288 330/124 R |
| 2005/0146383 A1 | 7/2005 | Moore et al. | |
| 2011/0269648 A1 | 11/2011 | Schwartz | |

FOREIGN PATENT DOCUMENTS

| | | |
|---|---|---|
| CN | 20242115 U | 9/2012 |
| EP | 1 452 867 A1 | 9/2004 |
| EP | 2 242 541 A1 | 7/2011 |
| WO | 03/069360 A1 | 8/2003 |
| WO | 2009/047703 A1 | 4/2009 |

OTHER PUBLICATIONS

Kyriakis-Bitzaros, Efstathios D., et al; "A Reconfigurable Multichannel Capacitive Sensor Array Interface"; IEEE Transactions on Instrumentation and Measurements, vol. 60, No. 9; (8 pages) (Sep. 2011).

Zampetti, E., et al; "Flexible sensorial system based on capacitive chemical sensors integrated with readout circuits fully fabricated on ultra thin substrate"; Sensors and Actuators B 155; pp. 768-774 (2011).

Extended European Search Report for application 13192869.9 (Jul. 14, 2014).

* cited by examiner

*Primary Examiner* — Hieu Nguyen
(74) *Attorney, Agent, or Firm* — McDonnell Boehnen Hulbert & Berghoff LLP

(57) ABSTRACT

The invention relates to a Doherty amplifier for amplifying an input signal at an operating frequency, comprising: a main amplifier; a first peak amplifier; a second peak amplifier, each of the amplifiers comprising an input for receiving the input signal and an output for providing an amplified signal, a plurality of peak amplifiers, each of the amplifiers comprising an input for receiving the input signal and an output for providing an amplified signal; a first input phase shifter; a second input phase shifter; a first capacitor coupled between the source and drain of the first peak amplifier; a first output phase shifter and a second output phase shifter.

13 Claims, 8 Drawing Sheets

DOHERTY AMPLIFIER

CROSS-REFERENCE TO RELATED APPLICATIONS

This application claims the priority under 35 U.S.C. §119 of European patent application no. 13290292.5, filed on Nov. 22, 2013, the contents of which are incorporated by reference herein.

The invention relates to a Doherty amplifier and in particular, although not exclusively, to a multi-way Doherty amplifier.

Doherty-type amplifiers are widely used as power amplifiers in wireless communications systems due to their high efficiency when handling variable power levels, which are common in multi-carrier wireless communications systems. A Doherty amplifier comprises a main amplifier and a peak amplifier, the main amplifier can handle power levels up to a certain transition point and the peak amplifier can provide additional power at power levels above the transition point up to a saturation point of the Doherty amplifier. Together, the main and peak amplifiers, which typically operate in different classes, can deliver an improved back-off power level efficiency compared with a similarly rated single stage AB- or A-class amplifier.

FIG. 1 illustrates a two-way Doherty amplifier. The two-way Doherty amplifier comprises two amplifier stages 1, 2, a first of these being a peak amplifier 1 and a second being a main amplifier 2. The peak amplifier 1 amplifies a phase-shifted version of an input signal, while the main amplifier 102 amplifies an unshifted version of the input signal. The phase shift is introduced into the phase-shifted version of the input signal by the splitter stage 3. A combiner stage 4 combines the output signals from the amplifier stages 1, 2 in-phase and provides an output amplified signal to a load 5. The use of phase shifted peak signals lowers the instantaneous power consumption demand of the amplifier when receiving peak level signals.

A classic Doherty power amplifier, in a symmetric or asymmetric implementation, has become the contemporary industry standard for telecommunication base station high efficiency amplifiers. However, with the continuously increasing demand for higher RF bandwidth and higher data rate transmissions, the physical limits of the performance of prior art implementations are quickly being approached.

According to a first aspect of the invention there is provided an integrated Doherty amplifier for amplifying an input signal at an operating frequency, comprising:
 a main amplifier;
 at least a first and a second peak amplifier, each of the amplifiers comprising a gate for receiving the input signal, a source and a drain for providing an amplified signal;
 a first input phase shifter between the gate of the main amplifier and the gate of the first peak amplifier;
 a second input phase shifter between the gate of the first peak amplifier and the gate of the second peak amplifier, wherein the first input phase shifter and second input phase shifter are each configured to shift the phase of the input signal by 90 degrees at the operating frequency;
 a first capacitor configured to be coupled between the drain of the first peak amplifier and ground;
 a first output phase shifter between the drain of the main amplifier and the drain of the first peak amplifier, wherein the first output phase shifter in combination with the first capacitor is configured to shift the phase of the amplified signals from the main amplifier by 90 degrees at the operating frequency; and
 a second output phase shifter between the drain of the first peak amplifier and the drain of the second peak amplifier, wherein the second output phase shifter in combination with the first capacitor is configured to shift the phase of the amplified signals from the first peak amplifier by 90 degrees at the operating frequency.

A multi-way integrated Doherty amplifier combines the advantage of both the multi-way and integrated technologies and so can provide very high efficiency and wide bandwidth. The first output capacitor may be provided in addition to a parasitic output capacitance of the first peak amplifier. The provision of the first capacitor may enable the second output phase shifter to provide the required impedance and/or phase shift and so enables the Doherty amplifier to be provided as an integrated Doherty amplifier. An integrated Doherty amplifier, including phase shifting circuitry, may be provided entirely within a single package or encapsulation. That is, the Doherty amplifier may be encased by a single encapsulation. The amplifier may therefore be compact and enable simplicity of manufacture and installation because it is provided within a single package.

The first capacitor may be directly coupled to the drain of the first peak amplifier. The first capacitor may be considered to be a component of the first and/or second output phase shifter.

The Doherty amplifier may comprise further peak amplifiers, such as a third peak amplifier for example.

The second output phase shifter may comprise a second capacitor with a first plate and a second plate. The first plate may be connected to a junction between the primary and secondary output phase shifter bond wires. The second plate may be coupled to the source of the second peak amplifier. That is, the second plate may be suitable for coupling to ground.

The second output phase shifter may comprise primary and secondary bond wires coupled in series. The first output phase shifter may be twice the combined impedance of the primary and secondary output phase shifter bond wires at the operating frequency. The provision of such an arrangement can allow the impedance and frequency response of the Doherty amplifier to be tuned more easily. In alternative topologies, the first output phase shifter may be a quarter, third, half, thrice, or four times the impedance of the second output phase shifter.

The main amplifier and the plurality of peak amplifiers may each comprise a field effect transistor with a gate providing the respective amplifier input, a source for coupling to ground and a drain for providing the respective amplifier output. Each transistor may have a parasitic input capacitance. Each transistor may have a parasitic output capacitance. An output phase shifter in between two adjacent amplifiers may comprise the parasitic output capacitance of each of the two amplifiers. An input phase shifter in between two adjacent amplifiers may comprise the parasitic input capacitance of each of the two amplifiers.

The first input phase shifter may comprise an integrated inductor. The first input phase shifter may comprise a bond wire or series of bond wires. The second input phase shifter may comprise an integrated inductor. The second input phase shifter may comprise a bond wire or series of bond wires.

The Doherty amplifier may comprise a zeroth capacitor configured to be coupled between the drain of the main amplifier and ground. The Doherty amplifier may comprise a second capacitor configured to be coupled between the drain of the second peak amplifier and ground. The output phase shifter in between two adjacent amplifiers may comprise a first output capacitor with a first plate coupled to the output of a first of the two adjacent amplifiers and a second plate for coupling to ground. The output phase shifter in between the two adjacent amplifiers may comprise a second output capacitor with a first plate coupled to the output of a second of the two adjacent amplifiers and a second plate for coupling to ground. The output phase shifter in between two adjacent amplifiers may comprise an inductor. The inductor may be coupled in series between the output of the first amplifier and the output of the second peak amplifier.

The output capacitor and inductor values may be chosen to provide the necessary characteristic impedance and a 90° phase shift. The inductor may be an integrated inductor or a bond wire. For some semiconductor technologies (e.g. LDMOS), the bond wire may be preferable to reduce the losses and then maximize the performance of the Doherty amplifier.

The input phase shifter in between two adjacent amplifiers may comprise the parasitic input capacitance of each of the two amplifiers. The input phase shifter in between two adjacent amplifiers may comprise an input inductor. The input inductor may be coupled in series between the input of the first peak amplifier and the input of the second peak amplifier. The input capacitor and input inductor values may be chosen to provide the necessary characteristic impedance and a 90° phase shift. The input inductor may be an integrated inductor or a bond wire. In case the output phase shifter comprises a bond wire, using an input integrated inductor would allow the electro-magnetic coupling between the input and output to be reduced, as both inductors would be in different planes. Performance degradation problems and stability issues may therefore be avoided. In case both the input and output phase shifters are made of bond wires, the main and peak amplifiers may be provided on different dies.

The first output phase shifter may comprise a bond wire. The first output phase shifter may comprise an integrated inductor. The first capacitor may be an integrated capacitor provided on the same die as the first peak amplifier. The first capacitor may be an integrated capacitor provided on the same die as the first peak amplifier.

The first input phase shifter may comprise a DC blocking capacitor. The second input phase shifter may comprise a DC blocking capacitor. The input phase shifters may each include a DC blocking capacitor. As such, different bias may be applied to each of the main and peak amplifiers.

In general, the input parasitic capacitor of a transistor is significantly larger than its output parasitic capacitor (~3× for the LDMOS technology). A series arrangement of an inductor and a capacitor may be connected to the input of each amplifier. Such a capacitor may have a first plate connected to the inductor and a second plate for connecting to ground. This series arrangement partially compensates for the input capacitance of the transistors and thus allows adjusting the input phase shifter characteristics (impedance and phase shift values). This series arrangement also provides an RF cold point (a node where the RF amplitude is relatively low) which may be convenient for supplying input bias to each amplifier.

The input and output phase shifters may be realized in several steps using a plurality of series inductors. Each series inductor may be connected to a shunt grounded capacitor.

The output capacitor may be an integrated capacitor. The output capacitor may be provided on the same die as the first peak amplifier. As such, the output capacitor can be directly coupled to the output of the first peak amplifier and so reduce the possibility of an additional impedance being introduced between them.

Each amplifier may comprise a plurality of field effect transistors. Each transistor may comprise a plurality of sub-transistors. As such, the power capability of the Doherty amplifier may therefore be increased. The peak amplifiers may be provided in a row. The input and output phase shifters may extend along a side of the row. The field effect transistors of each of the amplifiers may be provided in respective columns.

The main amplifier and peak amplifiers may have different maximum output power capabilities. Such an arrangement can lead to various multi-way Doherty amplifiers. The implementation of the Doherty amplifier may be varied depending on the performance that is required, such as high back-off efficiency and/or wide bandwidth, for example.

The Doherty amplifier may comprise one or more matching networks. The matching network may be provided between the gate of a particular main or peak amplifier and ground. Each network may comprising a capacitor and an inductor in series. The Doherty amplifier may further comprise a junction provided between the capacitor and the inductor of the matching network, the junction configured to receive a bias voltage for the first and second peak amplifiers.

The main amplifier and peak amplifiers may be provided on a single die.

According to a further aspect of the invention there may be provided a telecommunications base station comprising the Doherty amplifier described above.

Also disclosed is a Doherty amplifier for amplifying an input signal at an operating frequency, comprising:
  a main amplifier;
  a first peak amplifier;
  a second peak amplifier, each of the amplifiers comprising
    an input for receiving the input signal and an output for providing an amplified signal, each output having the same real output impedance at the operating frequency;
  a first output phase shifter coupled between the output of the main amplifier and the output of the first peak amplifier, wherein the first output phase shifter is configured to shift the phase of the amplified signals from the main amplifier by 90 degrees at the operating frequency and has a characteristic impedance with a real part that is matched to the real output impedance; and
  a second output phase shifter coupled between the output of the first peak amplifier and the output of the second peak amplifier, wherein the second output phase shifter is configured to shift the phase of the amplified signals from the first peak amplifier by 90 degrees at the operating frequency and has a characteristic impedance with a real part that is matched to half of the real output impedance.

This arrangement provides an 3-way Doherty amplifier with impedance-matched transmission lines coupling the first and second peak amplifier outputs. It has been found that the output impedance matched arrangement between the amplifiers results in a 3-way Doherty amplifier with an improved bandwidth performance compared to prior art solutions.

A first impedance can be considered to be matched to a second impedance if the impedances are the same. Two quantities can be considered to be the same if they are within 20%, 10%, 5% or 1% of one another, for example. A first quantity can be considered to be half of a second quantity if the first quantity is between 30% and 70%; 40% and 60%; 45% and 55% or 49% and 51% of the second quantity. The inverse applies where a first quantity is twice a second quantity. The operating frequency can be considered to be a point within an operating frequency bandwidth, such as the mid-point frequency, for example.

Each input may have the same real input impedance at the operating frequency. The Doherty amplifier may comprise a first input phase shifter between the input of the main amplifier and the input of the first peak amplifier. The Doherty amplifier may comprise a second input phase shifter coupled between the input of the first peak amplifier and the input of the second peak amplifier. The first input phase shifter and the second input phase shifter may each be configured to shift the phase of the input signal by 90 degrees at the operating frequency. The first input phase shifter and the second input phase shifter may each have a characteristic impedance with a real part that is matched to the real input impedance.

The Doherty amplifier may be an integrated amplifier. The main amplifier, the first peak amplifier and the second peak amplifier may each comprise a field effect transistor with a gate providing the respective amplifier input, a source for coupling to ground and a drain for providing the respective amplifier output. Each transistor may have a parasitic input capacitance. Each transistor may have a parasitic output capacitance. The second output phase shifter may comprise the parasitic output capacitance of the first and second peak amplifiers. The second output phase shifter may comprise a first output capacitor with a first plate coupled to the output of the first peak amplifier and a second plate for coupling to ground. The second output phase shifter may comprise two bond wires. The two bond wires may be coupled in series between the output of the first peak amplifier and the output of the second peak amplifier. The two bond wires may be coupled together at a node. The second output phase shifter may comprise a second output capacitor with a first plate coupled to the node and a second plate for coupling to ground.

The provision of an integrated Doherty amplifier can allow for simplicity of manufacture and installation compared to discrete amplifier architectures.

The first output capacitor may have the same capacitance as the second output capacitor. The first output capacitor may have the same capacitance as the output parasitic capacitance of the first peak amplifier. The two bond wires may have substantially the same impedance to one another. The two bond wires may have the same impedance to one another.

The first input phase shifter may be provided by an integrated inductor. The second input phase shifter may be provided by an integrated inductor.

The first output phase shifter may include a bond wire. The bond wire of the first output phase shifter may have twice the combined inductance of the two bond wires of the second output phase shifter. By providing the input phase shifters as integrated inductors and the output phase shifters as bond wires, cross coupling can be reduced as the inductors are in different planes.

The first input phase shifter may include a DC blocking capacitor. As such, different bias can be applied to the main amplifier and the peak amplifiers.

The first output capacitor may be an integrated capacitor. The first output capacitor may be provided on the same die as the first peak amplifier. As such, the first output capacitor can be directly coupled to the output of the first peak amplifier and reduce the possibility of an additional impedance being introduced between them.

Each transistor may comprise a plurality of sub-transistors. As such, the power capability of the amplifier may be increased.

The first peak amplifier and second peak amplifier may be provided in a row. The first and second output phase shifters may extend along a side of the row. The field effect transistors of each of the amplifiers may be provided in respective columns.

Each phase shifter may comprise a transmission line.

The main amplifier, first peak amplifier and second peak amplifier may have the same maximum output power capability. Such an arrangement can assist with the provision of amplifiers with the same input and output impedances.

The main amplifier, first peak amplifier and second peak amplifier may be provided on a single die.

Also disclosed is a Doherty amplifier for amplifying an input signal at an operating frequency, comprising: a main amplifier; a first peak amplifier; a second peak amplifier, each of the amplifiers comprising an input for receiving the input signal and an output for providing an amplified signal, a plurality of peak amplifiers, each of the amplifiers comprising an input for receiving the input signal and an output for providing an amplified signal; a first input phase shifter; a second input phase shifter; a first capacitor coupled between the source and drain of the first peak amplifier; a first output phase shifter and a second output phase shifter.

Optional features disclosed with regard to a particular amplifier may be provided in combination with another amplifier disclosed herein.

BRIEF DESCRIPTION OF DRAWINGS

One or more embodiments of the invention will now be described, by way of example only, and with reference to the accompanying figures in which:

FIGS. 2 and 3 illustrate alternative implementations of impedance matching arrangements at the input and output of three-way Doherty amplifiers. The example in FIG. 2 is implemented using transmission lines, whereas an equivalent arrangement of an integrated Doherty amplifier is illustrated with reference to FIG. 3.

FIG. 2 illustrates a three-way Doherty amplifier 200 comprises a main amplifier 202, a first peak amplifier 204, and a second peak amplifier 206. Each of the main, first peak and second peak amplifiers 202, 204 206 comprises a respective input 208, 210, 212 for receiving an input signal 214 and a respective output 216, 218, 220 for providing amplified signals that together form a combined output signal 222. Each of the amplifiers 202, 204, 206 has a similar maximum power output capability. That is, the Doherty amplifier 200 has a 1:1:1 architecture.

Figure 1:
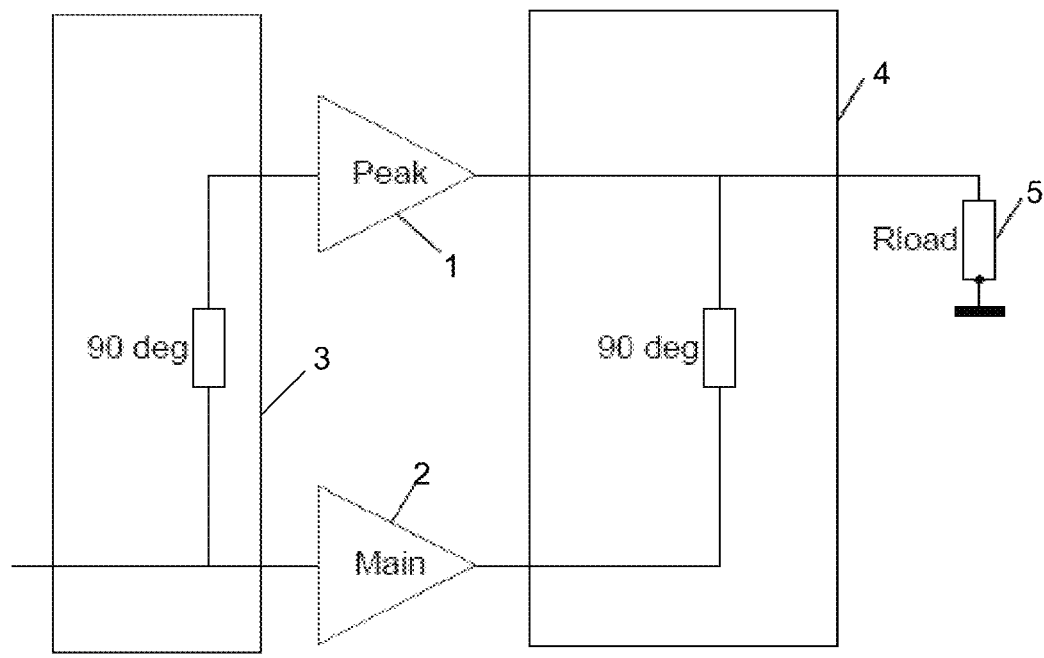
FIG. 1 illustrates a schematic of two-way Doherty amplifier.

Transmission lines 224, 226, 228, 230 are provided as phase shifters in order to stagger the phase at which the various amplifiers 202-206 are provided with the input signal 214 and to recombine the output signal 222 in phase. In addition, the input and output real impedance of the amplifiers 202-206 and the real part of the characteristic impedance of the transmission lines 224-230 have been matched in order to improve the attainable operating frequency bandwidth of the amplifier 200.

The real part of the input impedance (input resistance) of the main amplifier 202, referred to as the real input impedance $R_s$, is the same as the real part of the input impedance of both the first and second peak amplifiers 204, 206 at a particular operating frequency within the operating frequency bandwidth. Similarly, the real part of the output impedance (output resistance) of the main amplifier 202, referred to as the real output impedance $R_L$, is the same as the real part of the output impedance of each of the first and second peak amplifiers 204, 206 at the operating frequency.

The input signal 214 is applied directly to the input 208 of the main amplifier 202. A first input transmission line 224 is provided between the input 208 of the main amplifier 202 and the input 210 of the first peak amplifier 204. The first input transmission line 224 is configured to shift the phase of the input signal by 90 degrees at the operating frequency such that the signal received at the input 210 of the first peak amplifier 204 is a quarter of a cycle out of phase with that applied to the input 208 of the main amplifier 202. The first input transmission line 224 has a characteristic impedance with a real part that is matched to the real input impedance $R_s$ of the main amplifier 208 and/or first peak amplifier 210.

A second input transmission line 226 is provided between the input 210 of the first peak amplifier 204 and the input 212 of the second peak amplifier 206. The second input transmission line 226 is configured to shift the phase of the input signal by a further 90 degrees at the operating frequency such that the signal received at the input 212 of the second peak amplifier 206 is a quarter of a cycle out of phase with the signal applied to the input 210 of the first peak amplifier 204 and half a cycle out of phase with the signal applied to the input 208 of the main amplifier 202. The second input transmission line 226 has a characteristic impedance with a real part that is matched to the $R_s$ of the first peak amplifier 210 and/or second peak amplifier 212.

It takes a similar amount of time for the input signal to propagate through each of the main amplifier 202, first peak amplifier 204 and second peak amplifier 206.

A first output transmission line 228 is provided between the output 216 of the main amplifier 202 and the output 218 of the first peak amplifier 204. The first output transmission line 228 is configured to shift the phase of the output signal from the main amplifier 202 by 90 degrees at the operating frequency. The signal at the output 218 of the first peak amplifier 204 is therefore in phase with the phase-shifted signal from the output 216 of the main amplifier 202. The first output transmission line 228 has a characteristic impedance with a real part that is matched to the output real impedance $R_L$ of the main amplifier 208 and first peak amplifier 210.

A second output transmission line 230 is provided between the output 218 of the first peak amplifier 204 and the output 220 of the second peak amplifier 206. The second output transmission line 230 is configured to shift the phase of the output signal at the output 218 of the first peak amplifier by 90 degrees at the operating frequency. The signal received at the output 220 of the second peak amplifier 206 is therefore in phase with the phase-shifted signals from the output 218 of the first peak amplifier 204 and the output 216 of the main amplifier 202. The second output transmission line 230 has a characteristic impedance with a real part that is half of the output real impedance $R_L$ of the first peak amplifier 210 and/or second peak amplifier 212.

The various transmission lines 224-230 may be implemented using a variety of means, such as micro-strip lines, for example.

A comparison of the bandwidth performance of an amplifier such as the Doherty amplifier 200 and a Doherty amplifier such as that in FIG. 1 is discussed below with reference to FIG. 5.

Figure 2:
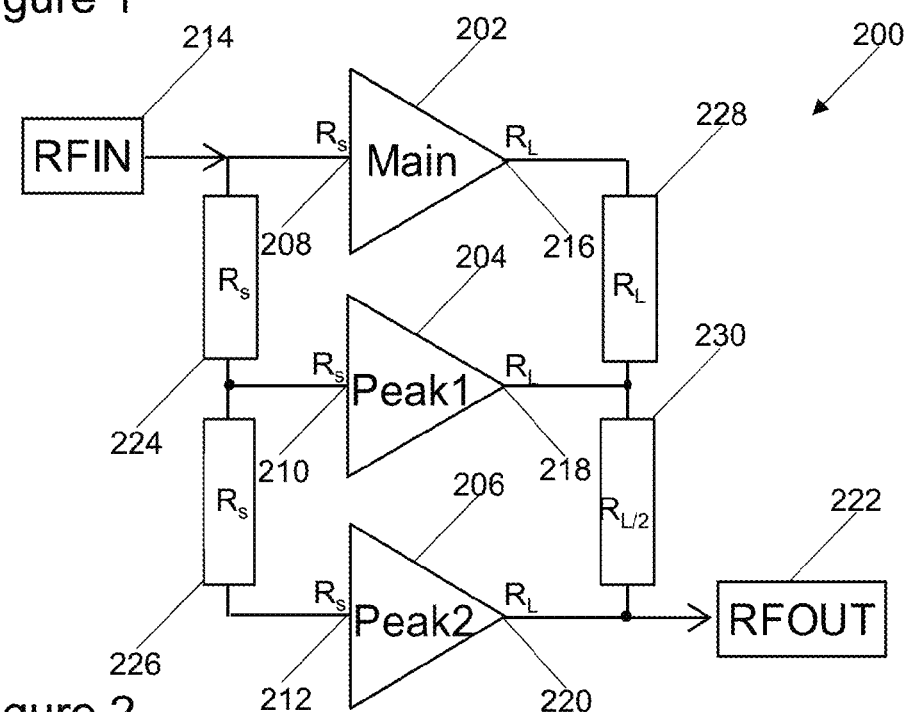
FIG. 2 illustrates a schematic of three-way 1:1:1 Doherty amplifier implemented using transmission lines.
Figure 3:
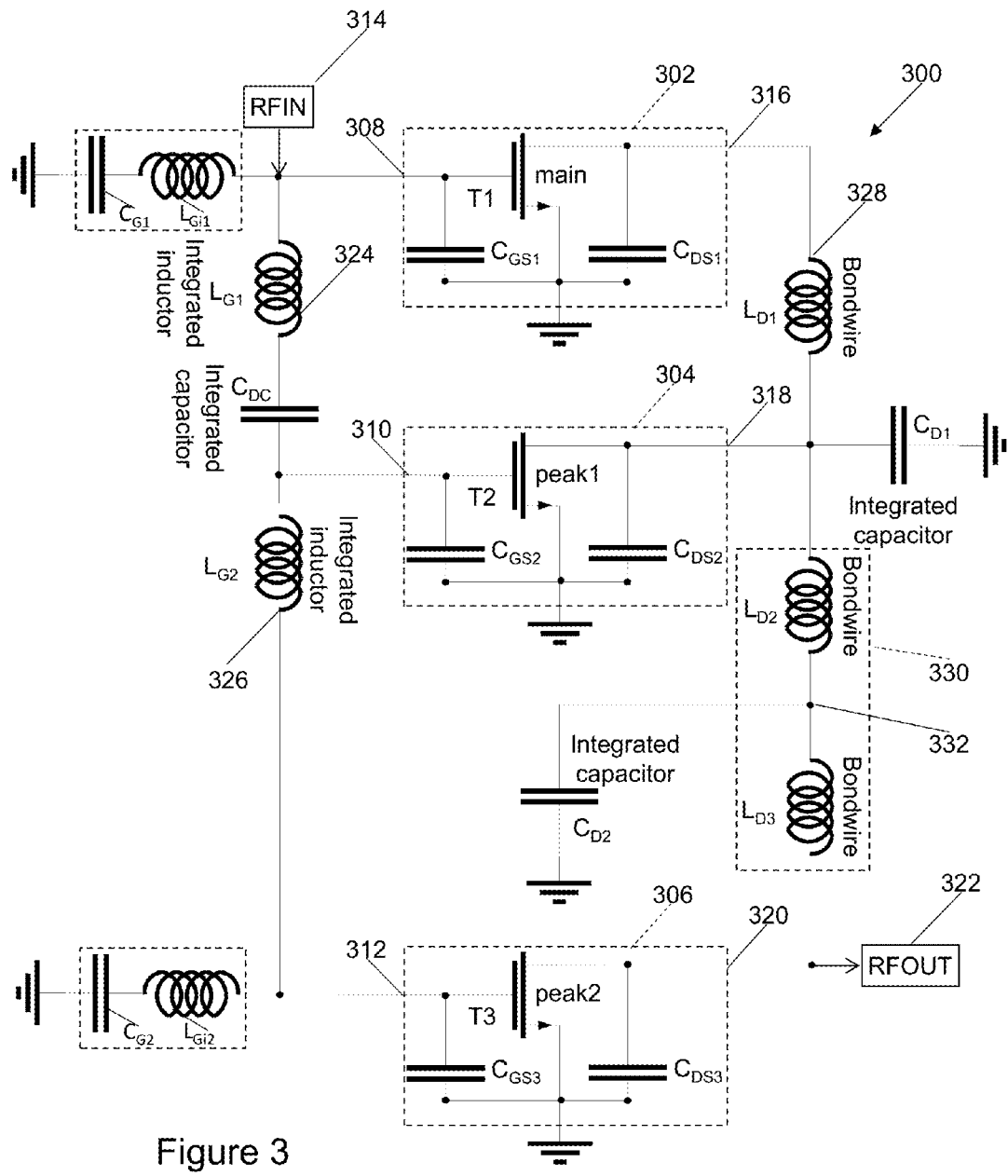
FIG. 3 illustrates a schematic of three-way integrated Doherty amplifier.

FIG. 3 shows a three-way integrated Doherty amplifier 300 that provides similar phase shifting and output matching performance to the Doherty amplifier illustrated in FIG. 2.

A corresponding series of reference numerals is used between FIGS. 2 and 3 to refer to components with similar functions.

The multi-way integrated Doherty amplifier 300 combines the advantage of both the multi-way and integrated technologies and so can provide very high efficiency and wide bandwidth. An integrated Doherty amplifier 300, including phase shifting circuitry as discussed below, may be provided entirely within a single package or encapsulation. The amplifier may therefore be more compact and enable simplicity of manufacture and installation.

The Doherty amplifier 300 is an integrated Doherty amplifier in which each of the amplifiers 302, 304, 306 has a similar maximum power output capability. Each of the amplifiers 302, 304, 306 comprises a field effect transistor (or a plurality of field effect transistors operating in parallel and so being functionally similar to a single field effect transistor).

Each field effect transistor has a gate coupled to the input 308, 310, 312 of the respective amplifier 302, 304, 306 and a drain coupled to the output 316, 318, 320 of the respective amplifier 302, 304, 306. A source of each of the field effect transistors is coupled to ground. In practical implementations, the field effect transistors each have an input parasitic capacitance $C_{GS1}$, $C_{GS2}$, $C_{GS3}$ between their respective gate and source terminals and an output parasitic capacitance $C_{DS1}$, $C_{DS2}$, $C_{DS3}$ between their respective drain and source terminals. The parasitic capacitances are such that conventional arrangements are insufficient to provide the required phase shift and power handling capabilities because of the requirements for impedance matching, as explained below.

Without the addition of further impedance elements, the input parasitic capacitance $C_{GS1}$, $C_{GS3}$ of the main and second peak amplifiers would be too high for some semiconductor technologies (e.g. ~1 pF/mm for the LDMOS technology) to be used effectively in a 90° Shunt C-Series L-Shunt C Pi network as required in the Doherty amplifier 300. In those cases, the proposed approach is to partially resonate these parasitic capacitances $C_{GS1}$, $C_{GS3}$ with the first and second integrated shunt inductors $L_{Gi1}$, $L_{Gi2}$. This is not needed for transistor T2, for which the input parasitic inductance $C_{GS2}$ is used in two 90° Shunt C-Series L-Shunt C Pi networks, meaning that approximately only half of the capacitance is used in each Pi network.

The input signal 314 is applied directly to the input 308 of the main amplifier 302. A first integrated inductor $L_{G1}$ 324 is provided in series with a DC blocking capacitor $C_{DC}$ between the input 308 of the main amplifier 302 and the input 310 of the first peak amplifier 304.

The first integrated inductor $L_{G1}$ in association with the parasitic input capacitance $C_{GS1}$ of the main amplifier 302 and the parasitic input capacitance $C_{GS2}$ of the first peak amplifier 304 forms a first C-L-C Pi network. A real part of a characteristic impedance of the first Pi network is the same as the real input impedance $R_S$ and is configured to shift the phase of the input signal 314 by 90 degrees at the operating frequency between the input 308 of the main amplifier 302 and the input 310 of the first peak amplifier 304. The first Pi network, and therefore the input parasitic capacitances $C_{GS1}$, $C_{GS2}$ of the main and first peak amplifiers 302, 304 can be considered to provide a phase shifter.

The DC block capacitor $C_{DC}$ may be provided by a component with a capacitance value that does not affect the phase shift of the signal at the operating frequency, as is known in the art. By blocking DC voltage transfer between the input 308 of the main amplifier 302 and the input 310 of the first peak amplifier 304, a different gate bias voltage can be applied to the main amplifier 302 and the peak amplifiers 304, 306.

A second integrated inductor $L_{G2}$ 326 is provided between the input 310 of the first peak amplifier 304 and the input 312 of the second peak amplifier 306.

The second integrated inductor $L_{G2}$ 326 in association with the parasitic input capacitance $C_{GS2}$ of the first peak amplifier 304 and the parasitic input capacitance $C_{GS3}$ of the second peak amplifier 306 forms a second C-L-C Pi network. A real part of a characteristic impedance of the second Pi network is the same as the real input impedance $R_S$. The second Pi network is configured to shift the phase of the input signal 314 by a further 90 degrees at the operating frequency between the input 310 of the first peak amplifier 304 and the input 312 of the second peak amplifier 306. The second Pi network, and therefore the input parasitic capacitances $C_{GS2}$, $C_{GS3}$ of the first and second peak amplifiers 304, 306 can be considered to be part of a phase shifter.

A first output series of bond wires $L_{D1}$ 328 is provided between the output 316 of the main amplifier 302 and the output 318 of the first peak amplifier 304. A first output capacitor $C_{D1}$ is coupled between the output 318 of the first peak amplifier 304 and ground. The first output capacitor $C_{D1}$ has the same capacitance as the second output capacitor $C_{D2}$ and the same capacitance as the output parasitic capacitances $C_{DS2}$ of the first peak amplifier 304. The first output capacitor $C_{D1}$ is parallel to the output parasitic capacitances $C_{DS2}$ of the first peak amplifiers 304 and therefore doubles the drain capacitance.

The series of bond wires $L_{D1}$ 328 in association with the first output capacitor $C_{D1}$, output parasitic capacitance $C_{DS1}$ of the main amplifier 302 and the output parasitic capacitance $C_{DS2}$ of the first peak amplifier 304 form a third C-L-C Pi network. The equivalent impedance, $Z_1$, of the third C-L-C Pi network is given by:

$$Z_1 = \sqrt{\frac{L_{D1}}{C_{D1}}}$$

A real part of a characteristic impedance of the third C-L-C Pi network is also the same as the real output impedance $R_L$. The third C-L-C Pi network is configured to shift the phase of the amplified signals from the main amplifier by 90 degrees at the operating frequency, f. The operating frequency is given by:

$$f = \frac{1}{2\pi\sqrt{L_{D1}C_{D1}}}$$

The third Pi network, and therefore the output parasitic capacitances $C_{DS2}$, $C_{DS3}$ of the main and first peak amplifiers 302, 304 can be considered to provide a phase shifter.

A second output series of bond wires $L_{D2}$ and a third output series of bond wires $L_{D3}$ are coupled in series between the output 318 of the first peak amplifier 304 and the output 320 of the second peak amplifier 306. The second and third output series of bond wires $L_{D2}$, $L_{D3}$ are connected at a node 332. A second output capacitor $C_{D2}$ is coupled between the node 332 and ground.

The second series of bond wires $L_{D2}$ has a quarter of the impedance of the first series of bond wires $L_{D1}$. The second output series of bond wires $L_{D2}$ in association with the output parasitic capacitance $C_{DS1}$ of the first peak amplifier 304, the first output capacitor $C_{D1}$ and the second output capacitor $C_{D2}$ form a fourth C-L-C Pi network. The equivalent impedance, $Z_2$, of the fourth C-L-C Pi network is given by:

$$Z_2 = \sqrt{\frac{L_{D2}}{C_{D1}}} = \sqrt{\frac{L_{D1}}{4C_{D1}}} = \frac{1}{2}\sqrt{\frac{L_{D1}}{C_{D1}}}$$

The fourth Pi network has a characteristic impedance with a real part that is half of the real output impedance ($R_L/2$) and is configured to shift the phase of the amplified signals from the first peak amplifier by 45 degrees at the operating frequency.

The third series of bond wires $L_{D3}$ has the same impedance as the second series of bond wires $L_{D2}$ and so has a quarter of the impedance of the first series of bond wires $L_{D1}$. The third output series of bond wires $L_{D3}$ in association with the second output capacitor $C_{D2}$ and the output parasitic capacitance $C_{DS3}$ of the second peak amplifier 306 form a fifth C-L-C Pi network. The fifth Pi network has a characteristic impedance with a real part that is half of the real output impedance ($R_L/2$) and is configured to shift the phase of the amplified signals from the first peak amplifier by 45 degrees at the operating frequency.

As a result, the conjunction of the fourth and fifth Pi networks together shift the phase of the amplified signals from the first peak amplifier by 90 degrees at the operating frequency and provide a characteristic impedance with a real part that is half of the real output impedance ($R_L/2$). The conjunction of the two output transmission lines of characteristic impedance $R_L$ and ($R_L/2$) allows the following conditions to be met:

at full power, the main amplifier and the two peak amplifiers are loaded by their optimum impedances $R_L$;
at low power, the main amplifier is loaded by 1.3 times $R_L$. This low load modulation on the main amplifier improves wide bandwidth response of the Doherty amplifier 300.

The signal from the main amplifier, first peak amplifier and second peak amplifier is therefore provided in phase as a combined output signal 322.

The use of integrated inductors at the input side of the amplifier 300 and bond wires at the output can reduce cross coupling between the inputs and the outputs and so improves the performance of the amplifier.

Figure 4:
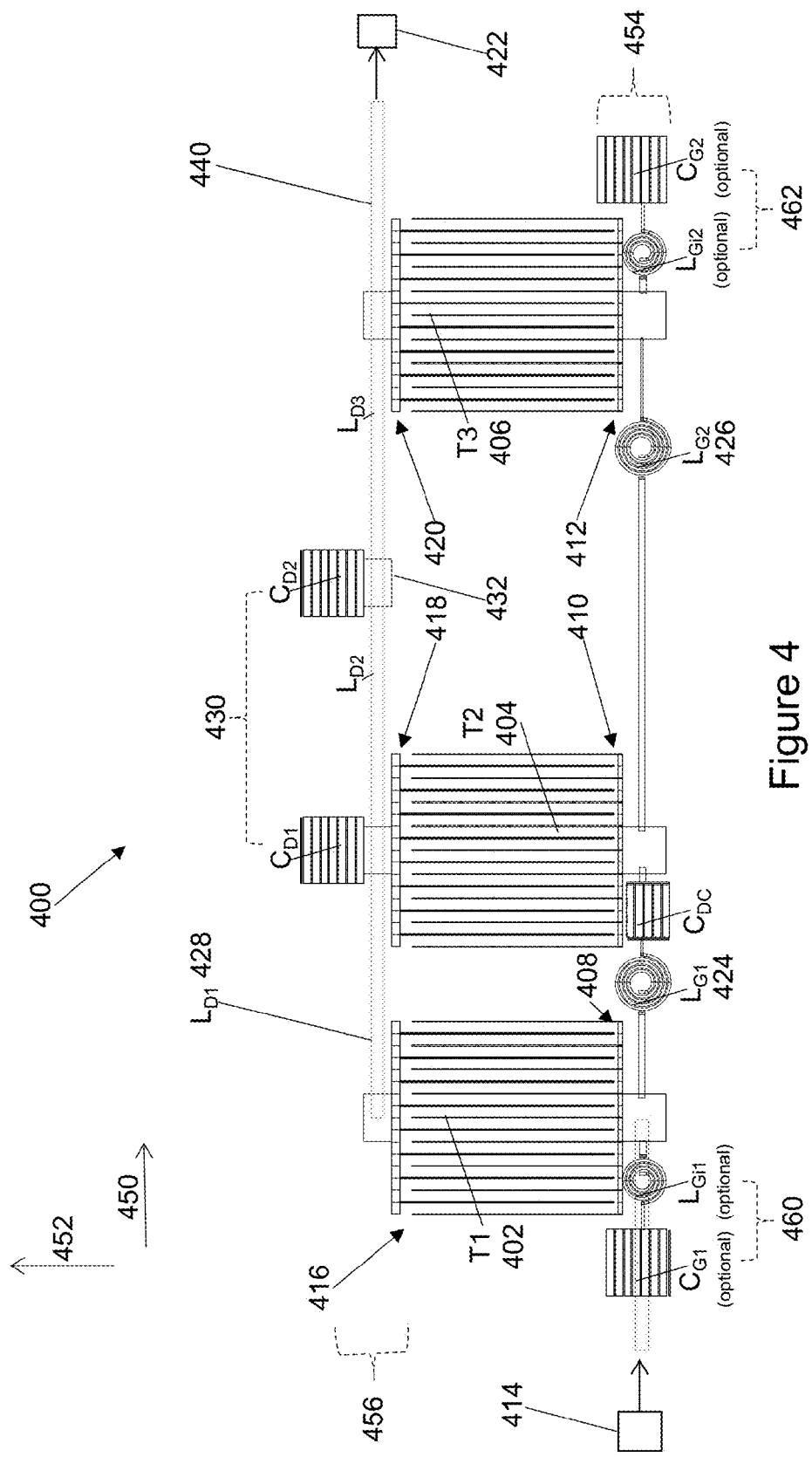
FIG. 4 illustrates a plan view of the components of an integrated Doherty amplifier similar to that described with reference to FIG. 3.

FIG. 4 illustrates a plan view of the components of an integrated Doherty amplifier 400 similar to the Doherty amplifier described with reference to FIG. 3. Corresponding series of reference numerals are used between FIGS. 3 and 4 to refer to similar components. In general, the similar features between FIGS. 3 and 4 will not be discussed further below.

The main amplifier 402, first peak amplifier 404 and second peak amplifier 406 are arranged in a row and are spaced apart in a signal propagation direction 450. Each amplifier comprises a plurality of transistors that are represented by lines that extend in a second direction 452 that is normal to the signal propagation direction 450. A gate of each transistor is provided as an input 408, 410, 412 on a first side of the respective amplifier 402, 404, 406. A drain of each transistor is provided as an output 416, 418, 420 on a second side of the respective amplifier 402, 404, 406. The second side is an opposite side to the first side and the two sides are spaced apart in the second direction 452. The source (not shown) of each transistor is provided coupled to a ground plane that is parallel to the arrangement shown in the plan view. The signal path length from the input 414 to the output 422 of the Doherty amplifier is the same through each of the amplifiers 402, 404, 406.

The amplifier 400 is a 1:1:1 Doherty amplifier. That is, each of the amplifiers 402, 404, 406 has the same gate area and drain area. The power handling capabilities of each of the amplifiers 402, 404, 406 is therefore the same.

The amplifier comprises a number of capacitors $C_{D1}$, $C_{D2}$, $C_{DC}$ as described in regard to FIG. 3 and additional capacitors $C_{G1}$, $C_{G2}$ as discussed below. A first plate of each of the capacitors $C_{D1}$, $C_{D2}$, $C_{G1}$, $C_{DC}$, $C_{G2}$ is provided by an area of conductive material shown in the plan view. A second plate of each capacitor $C_{D1}$, $C_{D2}$, $C_{G1}$, $C_{DC}$, $C_{G2}$ is provided by the ground plane of the amplifier 400.

The first and second integrated inductors 424, 426 are provided in a first row 454 that extends in the signal propagation direction 450 adjacent to the first side of the amplifiers 402, 404, 406. A DC blocking capacitor $C_{DC}$ is provided in series with a first integrated inductor $L_{G1}$. A bias voltage for the main amplifier 402 may be applied direct to the input signal 414. The DC blocking capacitor $C_{DC}$ ensures that the first peak amplifier 404 is isolated from this bias voltage. The first integrated inductor 424 is coupled between the input 408 of the main amplifier 402 and the input 410 of the first peak amplifier 404. The second integrated inductor $L_{G2}$ is coupled between the input 410 of the first peak amplifier 404 and the input 412 of the second peak amplifier 406.

In this example, an optional input stage 460 and optional biasing stage 462 are provided. The input stage 460 and biasing stage 462 are disposed in the first row 454. The input stage 460 comprises a first input capacitor $C_{G1}$ and an integrated inductor $L_{Gi1}$. This series arrangement partially compensates for the input capacitor of the main and peak amplifiers 402, 404, 406 and thus allows the input phase shifter characteristics, such as impedance and phase shift values, to be adjusted.

The biasing stage 462 comprises a first biasing capacitor $C_{G2}$ and an integrated biasing inductor $L_{Gi2}$. An additional effect of the arrangement of the first and second bond wires 424, 426 is that an RF "cold point" (a node where the RF amplitude is relatively low) is created between the first biasing capacitor $C_{G2}$ and the integrated biasing inductor $L_{Gi2}$. A bias voltage for the first and second peak amplifiers 404, 406 may therefore be applied between the first biasing capacitor $C_{G2}$ and the integrated biasing inductor $L_{Gi2}$.

The first, second and third series of output bond wires $L_{D1}$, $L_{D2}$, $L_{D3}$ are coupled in series and provided in a second row 456 that extends in the signal propagation direction 450 adjacent to the second side of the amplifiers 402, 404, 406. A first plate of a first output capacitor $C_{D1}$ is coupled to the output 418 of the first peak amplifier 404. A first plate of a second output capacitor $C_{D2}$ is coupled between the node 432 and ground. An output series of bond wires 440 is also provided in the second row 456 between the second peak amplifier 406 and the output terminal 422.

In a symmetric Doherty amplifier, the main amplifier needs to be matched simultaneously to the load corresponding to the maximum power and to twice this load when working at low power. The matching to the low power load is the most stringent and is illustrated as a function of frequency in FIG. 5.

Figure 5A:
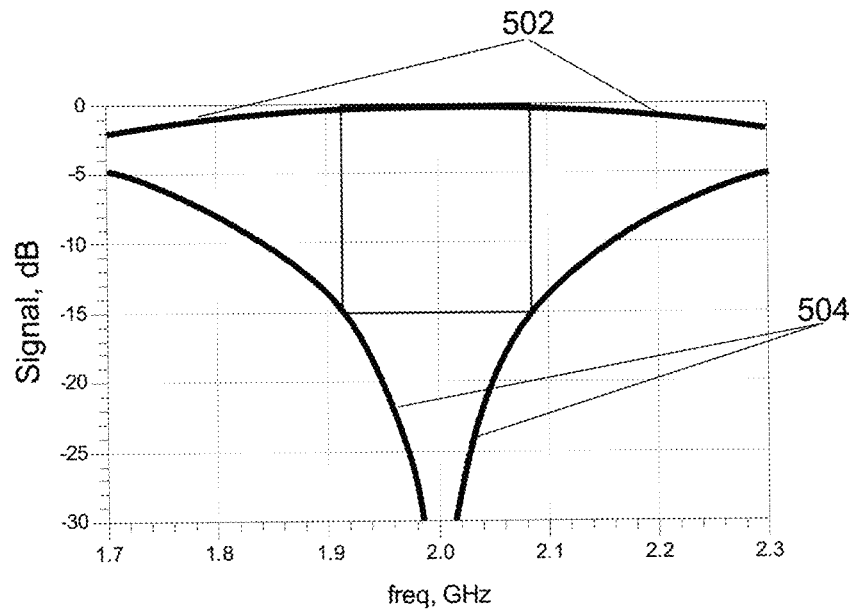
FIG. 5a illustrates a simulated profile that demonstrates the bandwidth of a Doherty amplifier similar to that of FIG. 1.

FIG. 5a illustrates a simulated profile that demonstrates the bandwidth of an amplifier similar to that in FIG. 1. The upper profile 502 represents loss due to the matching network and is close to 0 dB throughout the frequency range shown. The upper profile 502 is closest to 0 dB at the mid-point frequency of 2 GHz and falls to −2 dB as the frequency decreases towards 1.7 GHz or increases towards 2.3 GHz. The lower profile 504 represents the quality of matching provided by the amplifier. The lower profile 504 falls from −5 dB to beyond −30 dB as the signal frequency is varied between 1.7 GHz and 1.98 GHz. The lower profile 504 rises from −30 dB to −5 dB as the signal frequency is varied between around 2.02 GHz and 2.3 GHz. The upper profile 502 and lower profile 504 are both roughly symmetrical about 2.0 GHz.

The useful bandwidth of the amplifier is defined as being the frequency range in which the lower profile 504 is less than −15 dB. The operating frequency band is approximately 172 MHz around a mid-point of 2 GHz. This equates to an 8.6% bandwidth.

Figure 5B:
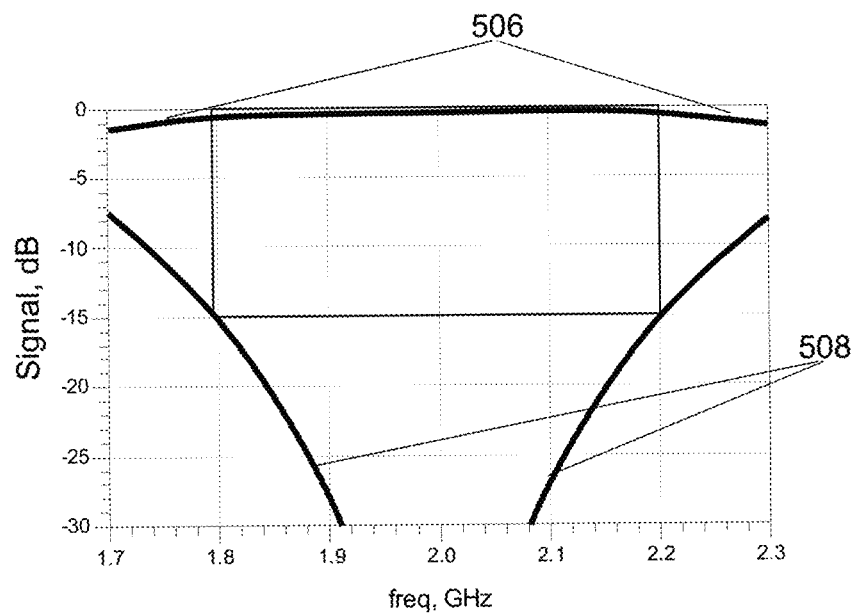
FIG. 5b illustrates a simulated profile that demonstrates the bandwidth of a Doherty amplifier similar to that of FIG. 2.

FIG. 5b illustrates a simulated profile that demonstrates the bandwidth of an amplifier similar to that in FIG. 2.

The upper profile 506 represents loss due to the matching network and is close to 0 dB throughout the frequency range shown. The upper profile 506 is closest to 0 dB at the mid-point frequency of 2 GHz and falls to −1.5 dB as the frequency is decreased towards 1.7 GHz or increased towards 2.3 GHz. The lower profile 508 represents the quality of matching provided by the amplifier. The lower profile 508 falls from −7.5 dB to beyond −30 dB as the signal frequency is varied between 1.7 GHz and approximately 1.92 GHz. The lower profile 508 rises from −30 dB to −7.5 dB as the signal frequency is varied between approximately 2.08 GHz and 2.3 GHz. The upper profile 506 and lower profile 508 are both roughly symmetrical about 2.0 GHz.

The useful bandwidth of the amplifier is defined as being the frequency range in which the lower profile 508 is less than −15 dB. The operating frequency band is approximately 408 MHz around a mid-point of 2 GHz. This equates to a 20.4% bandwidth. For a limited carrier load modulation (1.3:1), the architecture shown in FIG. 3 enables a wide RF bandwidth (>>20%) to be achieved, allowing with ease the coverage of the 1.8 to 2.2 GHz communication bands.

Alternative dedicated layout arrangements can be provided to realize a practical integrated multi-way Doherty amplifier.

Figure 6:
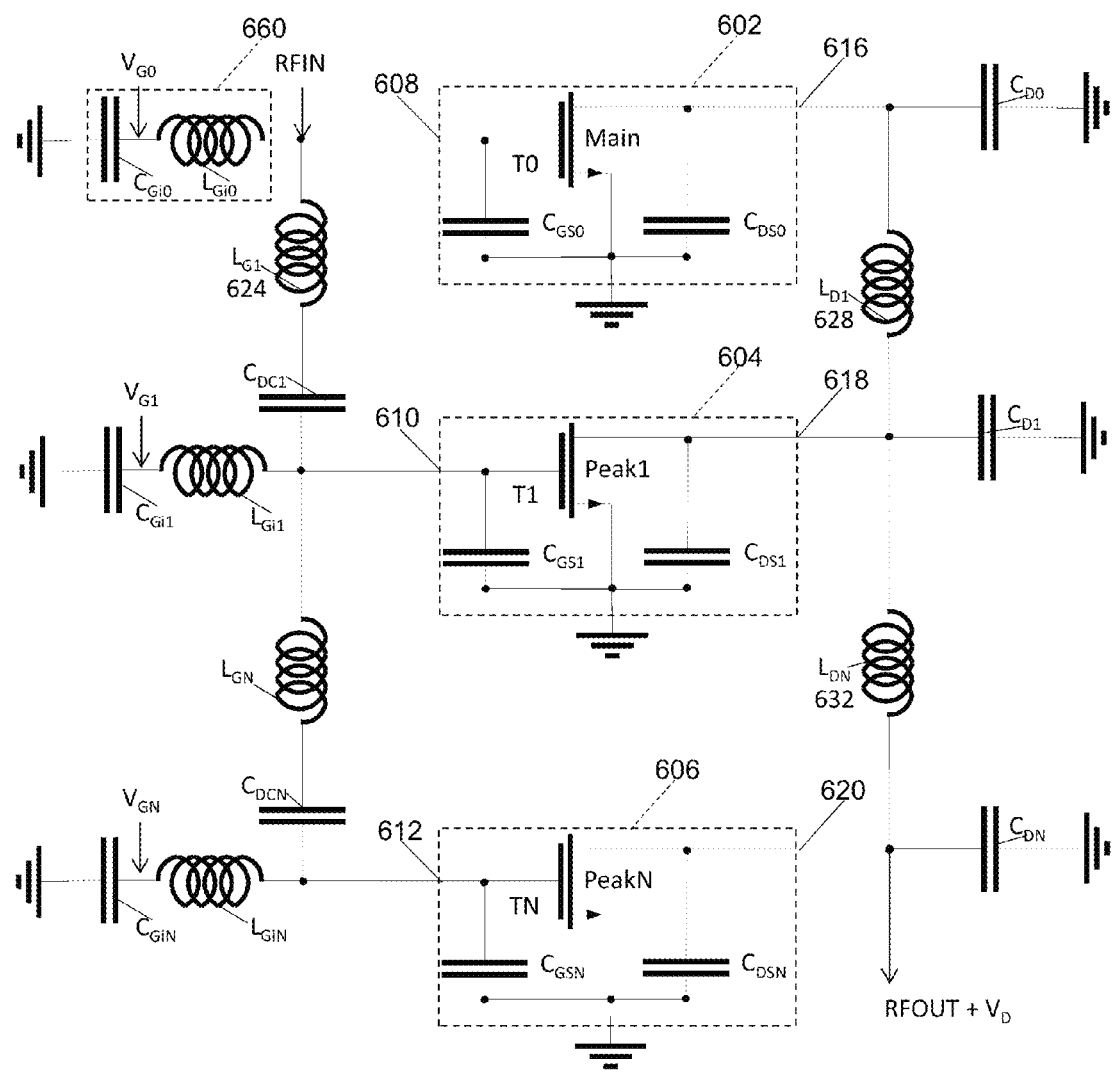
FIG. 6 illustrates a schematic of a multi-way integrated Doherty amplifier.

FIG. 6 illustrates a plan view of a multi-way integrated Doherty amplifier 600. The amplifier 600 is similar in many respects to the integrated Doherty amplifier described with reference to FIG. 3. A corresponding series of reference numerals is used between FIGS. 3 and 6 to refer to components with similar functions. In general, similar components between FIGS. 3 and 6 will not be described further in detail with reference to FIG. 6.

In this example, the second peak amplifier is described as an nth peak amplifier 606. A further nth peak amplifier and the components associated with the nth peak amplifier (discussed below) can be duplicated and connected in parallel with the plurality of peak amplifiers shown in FIG. 6.

The integrated Doherty amplifier 600 comprises a main amplifier 602 and a plurality of peak amplifiers 604, 606. Each amplifier 602, 604, 606 comprises a field effect transistor (or a plurality of field effect transistors operating in parallel and so being functionally similar to a single field effect transistor). Each field effect transistor has a gate coupled to the input 608, 610, 612 of the respective amplifier 602, 604, 606 and a drain coupled to the output 616, 618, 620 of the respective amplifier 602, 604, 606. A source of each of the field effect transistors is coupled to ground.

An input stage 660 is provided that comprises a first input capacitor $C_{Gi0}$ and a first input inductor $L_{Gi0}$ coupled in series between the input 608 of the main amplifier 602 and ground. The bias voltage $V_{G0}$ is applied at a node between the first input capacitor $C_{Gi0}$ and the first input inductor $L_{Gi0}$. The input signal 614 is applied to the input 608 of the main amplifier 602.

A first input phase shifter is provided between the input 608 of the main amplifier 602 and the input 610 of the first peak amplifier 604. The first input phase shifter comprises a first integrated inductor $L_{G1}$ 624 which is provided in series with a first DC blocking capacitor $C_{DC1}$. The first input phase shifter also comprises a series arrangement of an inductor $L_{Gi1}$ and a capacitor $C_{Gi1}$ coupled between the input 610 of the first peak amplifier 604 and ground.

An nth input phase shifter is provided between the input 610 of the first peak amplifier 604 (or more generally the (n−1)th peak amplifier) and the input 612 of the nth peak amplifier 606. The nth input phase shifter comprises a first integrated inductor $L_{GN}$ which is provided in series with an optional nth DC blocking capacitor $C_{DCN}$. The optional nth DC blocking capacitor $C_{DCN}$ enables the first peak amplifier 604 (on more generally the (n−1)th peak amplifier) and the nth peak amplifier 606 to be held at different bias potentials $V_{G0}$, $V_{G1}$, $V_{GN}$. The nth input phase shifter also comprises a series arrangement of an nth inductor $L_{GiN}$ and an nth capacitor $C_{GiN}$ coupled between the input 612 of the nth peak amplifier 606 and ground.

A first output series of bond wires $L_{D1}$ 628 is provided between the output 616 of the main amplifier 602 and the output 618 of the first peak amplifier 604. A zeroth output capacitor $C_{D0}$ is coupled between the output 616 of the main amplifier 602 and ground. The zeroth output capacitor $C_{D0}$ is parallel to the output parasitic capacitances $C_{DS0}$ of the main amplifier 602 and therefore increases the drain capacitance. A first output capacitor $C_{D1}$ is coupled between the output 618 of the first peak amplifier 604 and ground, as in the example in FIG. 3.

The first output series of bond wires $L_{D1}$ 628 in association with the zeroth output capacitor $C_{D0}$, the first output capacitor $C_{D1}$, output parasitic capacitance $C_{DS0}$ of the main amplifier 602 and the output parasitic capacitance $C_{DS1}$ of the first peak amplifier 604 form a third C-L-C Pi network that corresponds to that of FIG. 3.

An nth output bond wire $L_{DN}$ 632 is provided between the output 618 of the first peak amplifier 604 (or more generally the (n−1)th peak amplifier) and the output 620 of the nth peak amplifier 606. An nth output capacitor $C_{DN}$ is coupled between the output 620 of the nth peak amplifier 602 and ground.

The nth output series of bond wires $L_{DN}$ 632 in association with the nth output capacitor $C_{DN}$, the first output capacitor $C_{D1}$, output parasitic capacitance $C_{DS1}$ of the first peak amplifier 602 and the output parasitic capacitance $C_{DSN}$ of the nth peak amplifier 606 form a fourth C-L-C Pi network that corresponds to the fourth and fifth networks of FIG. 3.

An additional one or more nth peak amplifiers can be provided by providing a duplicate nth peak amplifier 606; nth inductor $L_{GiN}$; nth capacitor $C_{GiN}$; nth output bond wire $L_{DN}$; nth output capacitor $C_{DN}$; and, optionally, a duplicate nth DC blocking capacitor $C_{DCN}$, provided between the input 610 the first peak amplifier 604 and the input 612 of the nth peak amplifier 606.

Figure 7:
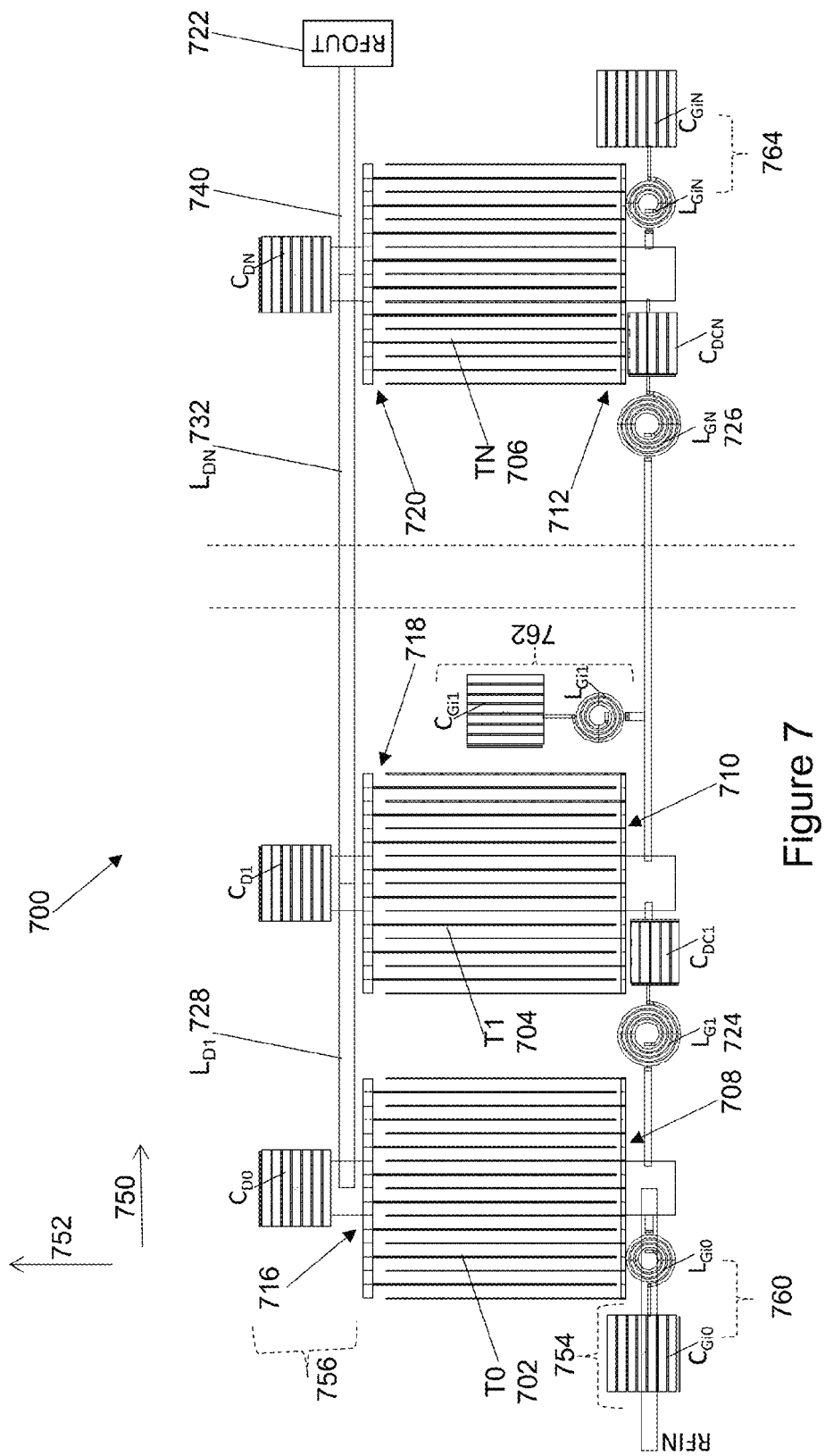
FIG. 7 illustrates a plan view of the components of an integrated Doherty amplifier similar to that described with reference to FIG. 6.

FIG. 7 illustrates a plan view of the components of an integrated Doherty amplifier 700 similar to that described with reference to FIG. 6. The arrangement of the integrated Doherty amplifier 700 is broadly similar to that of FIG. 4.

The main amplifier 702 (T0), first peak amplifier 704 (T1) and nth peak amplifier 706 (Tn) are arranged in a row and are spaced apart in a signal propagation direction 750. Each amplifier comprises a plurality of transistors that are represented by lines that extend in a second direction 752 that is normal to the signal propagation direction 750. A gate of each transistor is provided as an input 708, 710, 712 on a first side of the respective amplifier 702, 704, 706. A drain of each transistor is provided as an output 716, 718, 720 on a second side of the respective amplifier 702, 704, 706. The second side is an opposite side to the first side and the two sides are spaced apart in the second direction 752. The source (not shown) of each transistor is provided coupled to a ground plane that is parallel to the arrangement shown in the plan view. The signal path length from the input 714 to the output 722 of the Doherty amplifier is the same through each of the amplifiers 702, 704, 706.

The amplifier comprises a number of capacitors $C_{D0}$, $C_{D1}$, $C_{DN}$, $C_{DC1}$, $C_{Gi1}$, $C_{GiN}$, $C_{Gi0}$ as discussed below. A first plate of each of the capacitors $C_{D1}$, $C_{D2}$, $C_{Gi1}$, $C_{DC}$, $C_{GiN}$, $C_{Gi0}$ is provided by an area of conductive material shown in the plan view of FIG. 7. A second plate of each capacitor $C_{D1}$, $C_{D2}$, $C_{Gi1}$, $C_{DC}$, $C_{GiN}$, $C_{Gi0}$ is provided by the ground plane of the amplifier 700.

The first and nth integrated inductors 724, 726 are provided in a first row 754 that extends in the signal propagation direction 750 adjacent to the first side of the amplifiers 702, 704, 706. A DC blocking capacitor $C_{DC1}$ is provided in series with a first integrated inductor $L_{G1}$. The DC blocking capacitor $C_{DC1}$ ensures that the first peak amplifier 704 is isolated from any bias voltage applied to the input signal. A DC blocking capacitor $C_{DCN}$ is provided in series with nth integrated inductor $L_{GN}$. The DC blocking capacitor $C_{DCN}$ ensures that the nth peak amplifier 706 is isolated from any bias voltage applied to previous peak amplifiers. The first integrated inductor 724 is coupled between the input 708 of the main amplifier 702 and the input 710 of the first peak amplifier 704. The nth integrated inductor $L_{GN}$ is coupled between the input of the first (or (n−1)th) peak amplifier and the input 712 of the nth peak amplifier 706.

An optional input stage 760 and optional biasing stages 762, 764 are provided by matching networks. The input stage 760 and biasing stages 762, 764 are disposed in the first row 754.

The input stage 760 comprises a first input capacitor $C_{Gi0}$ and an integrated inductor $L_{Gi0}$.

The biasing stage 762 comprises a first biasing capacitor $C_{Gi1}$ and an integrated biasing inductor $L_{Gi1}$. An additional effect of this arrangement is that an RF "cold point" (a node where the RF amplitude is relatively low) is created between the first biasing capacitor $C_{Gi1}$ and the integrated biasing inductor $L_{Gi1}$.

The biasing stage 764 comprises a first biasing capacitor $C_{GiN}$ and an integrated biasing inductor $L_{GiN}$. An additional effect of this arrangement is that an RF "cold point" is created between the first biasing capacitor $C_{GiN}$ and the integrated biasing inductor $L_{GiN}$. Different bias voltages $V_{G1}$, $V_{GN}$ for the first and nth peak amplifiers 704, 706 may therefore be applied.

The first and nth series of output bond wires $L_{D1}$ 728, $L_{DN}$ 732 are coupled in series and provided in a second row 756 that extends in the signal propagation direction 750 adjacent to the second side of the amplifiers 702, 704, 706. A first plate of a zeroth output capacitor $C_{D0}$ is coupled to the output 716 of the main amplifier 702. A first plate of a first output capacitor $C_{D1}$ is coupled to the output 718 of the first peak amplifier 704. A first plate of the nth output capacitor $C_{DN}$ is coupled to the output 720 of the nth peak amplifier 706. An output series of bond wires 740 is also provided in the second row 756 between the nth peak amplifier 706 and the output terminal 722.

Figure 8:
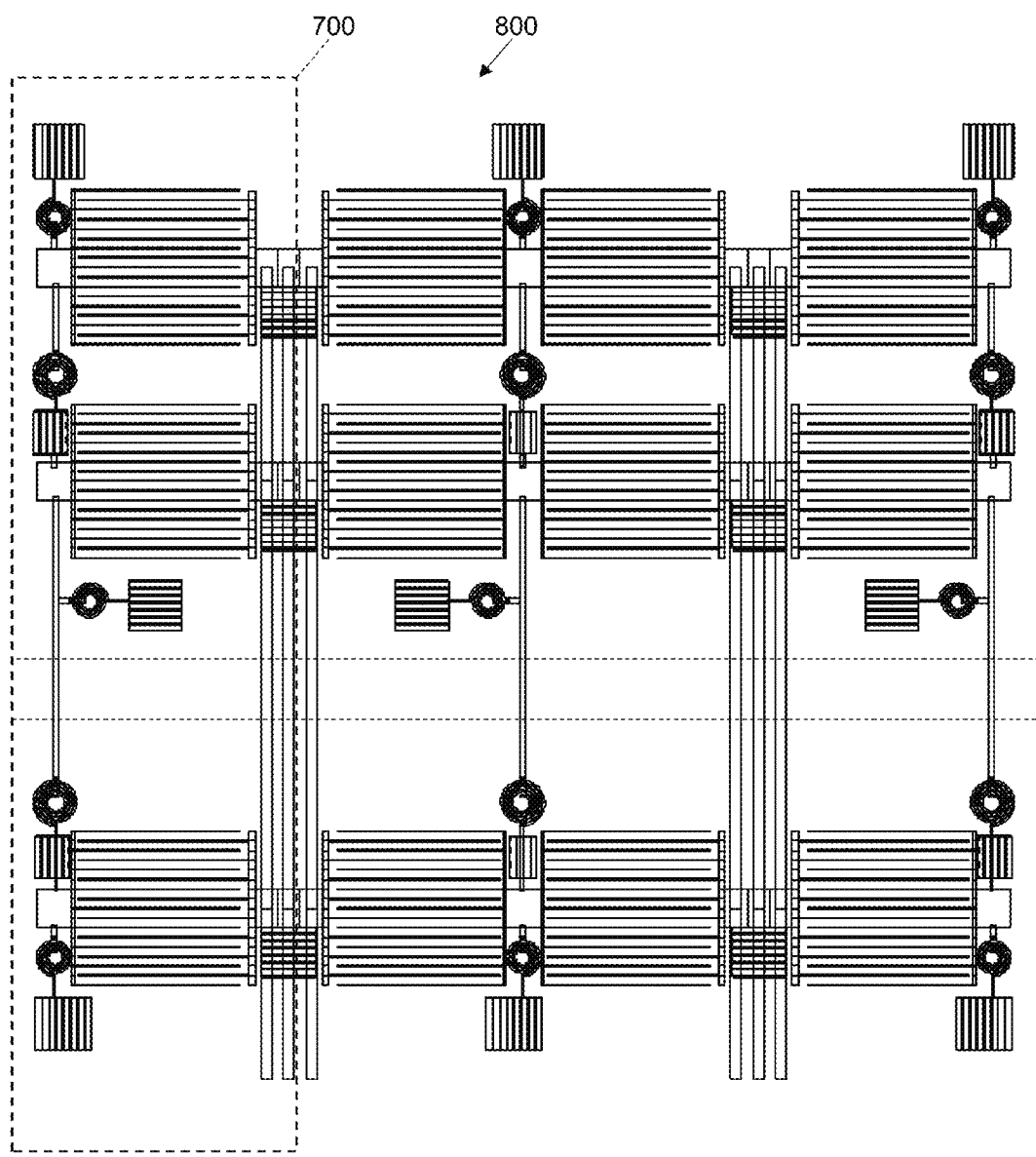
FIG. 8 illustrates a plan view of the components of an integrated Doherty amplifier based on the amplifier from FIG. 7 and duplicated in column to enable more peak power.

FIG. 8 illustrates a plan view of the components of an integrated Doherty amplifier based on the Doherty amplifier 700 of FIG. 7. A number of duplicate columns of the Doherty amplifier 700 shown in FIG. 7 are provided in parallel in order to enable more peak power to be handled by the amplifier 800. In general, drains and gates of a column are coupled to respective drains and gates of an adjacent column.

Figure 9:
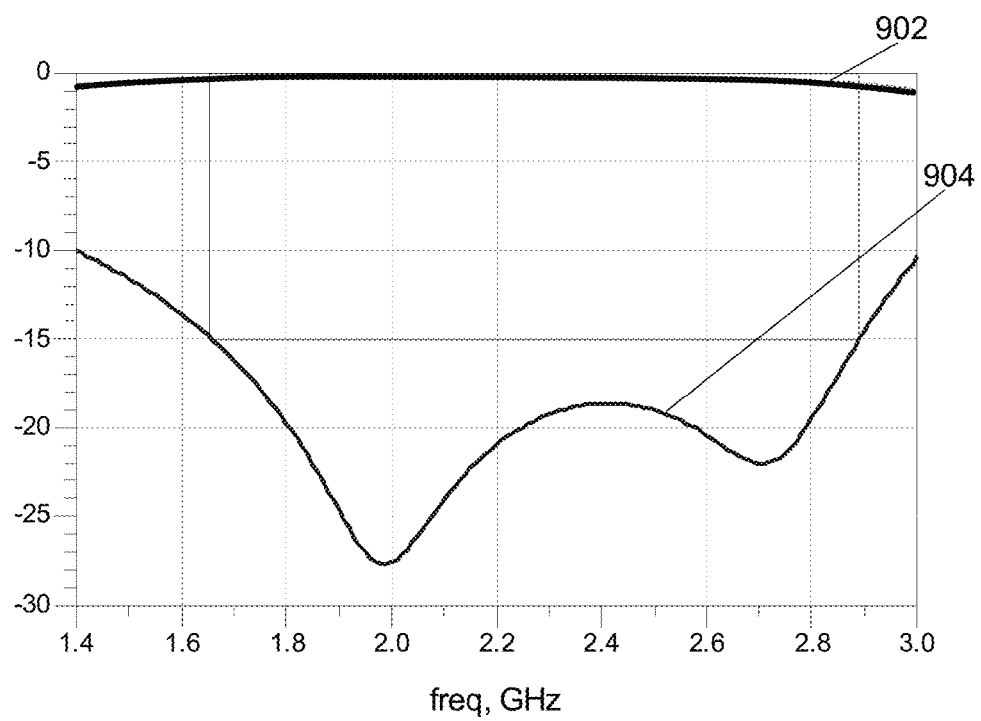
FIG. 9 illustrates a simulated profile that demonstrates the bandwidth of a Doherty amplifier similar to that of FIG. 3.

FIG. 9 illustrates a simulated profile that demonstrates the bandwidth of a Doherty amplifier similar to that of FIG. 3.

The upper profile 902 represents loss due to the matching network and is close to 0 dB throughout the frequency range shown. The upper profile 902 is closest to 0 dB at around 2 GHz and falls to −0.5 dB as the frequency decreases towards 1.4 GHz or increases towards 3 GHz.

The lower profile 904 represents the quality of matching provided by the amplifier. Two minima are shown in the lower profile 904 over the frequency range of 1.4 to 3 GHz. The lower profile 904 falls from −10 dB to −27 dB as the signal frequency is varied between 1.4 GHz and around 2 GHz. The lower profile 904 rises from −27 dB to −18 dB as the signal frequency is varied between around 2 GHz and 2.4 GHz. The lower profile 904 falls from −18 dB to −22 dB as the signal frequency is varied between 2.4 GHz and around 2.7 GHz. The lower profile 904 rises from −22 dB to around −10 dB as the signal frequency is varied between around 2.7 GHz and 3 GHz.

The useful bandwidth of the amplifier is defined as being the frequency range in which the lower profile 904 is less than −15 dB. The operating frequency band is approximately 1.25 GHz around a mid-point of around 2.3 GHz. This equates to a 54% bandwidth.

The invention claimed is:

1. An integrated Doherty amplifier for amplifying an input signal at an operating frequency, comprising:
   a main amplifier;
   at least a first and a second peak amplifier, each of the amplifiers comprising a gate for receiving the input signal, a source and a drain for providing an amplified signal;
   a first input phase shifter comprising an integrated lumped inductor between the gate of the main amplifier and the gate of the first peak amplifier;
   a second input phase shifter comprising an integrated lumped inductor between the gate of the first peak amplifier and the gate of the second peak amplifier, wherein the first input phase shifter and second input phase shifter are each configured to shift the phase of the input signal by 90 degrees at the operating frequency, wherein the first input phase shifter and/or second input phase shifter further comprises a DC blocking capacitor;
   a first integrated lumped capacitor configured to be coupled between the drain of the first peak amplifier and ground;
   a first output phase shifter between the drain of the main amplifier and the drain of the first peak amplifier, wherein the first output phase shifter in combination with the first integrated lumped capacitor is configured to shift the phase of the amplified signals from the main amplifier by 90 degrees at the operating frequency; and
   a second output phase shifter between the drain of the first peak amplifier and the drain of the second peak amplifier, wherein the second output phase shifter in combination with the first integrated lumped capacitor is configured to shift the phase of the amplified signals from the first peak amplifier by 90 degrees at the operating frequency.

2. The amplifier of claim 1 comprising:
   a zeroth capacitor configured to be coupled between the drain of the main amplifier and ground; and
   a second capacitor configured to be coupled between the drain of the second peak amplifier and ground.

3. The amplifier of claim 1 wherein the second output phase shifter comprises primary and secondary output phase shifter bond wires coupled in series.

4. The amplifier of claim 3 wherein the first output phase shifter is twice the combined impedance of the primary and secondary output phase shifter bond wires at the operating frequency.

5. The amplifier of claim 3 wherein the second output phase shifter comprises a second capacitor with a first plate and a second plate, the first plate connected to a junction between the primary and secondary output phase shifter bond wires, the second plate configured to be coupled to ground.

6. The amplifier of claim 1 wherein the first output phase shifter comprises a bond wire.

7. The amplifier of claim 1 wherein the first peak amplifier is provided on a die and the first integrated lumped capacitor is provided on the same die as the first peak amplifier.

8. The amplifier of claim 1 further comprising a matching network provided between the gate of a particular main or peak amplifier and ground, the matching network comprising a capacitor and an inductor in series.

9. The amplifier of claim 8 further comprising a junction provided between the capacitor and the inductor of the matching network, the junction configured to receive a bias voltage for the particular amplifier.

10. The amplifier of claim 1 wherein the main amplifier, first peak amplifier and second peak amplifier are provided in a row and transistors of each of the amplifiers are provided in respective columns.

11. The amplifier of claim 1, wherein the Doherty amplifier is encased by a single encapsulation.

12. The amplifier of claim 1 wherein the main amplifier, first peak amplifier and second peak amplifier are provided on a single die.

13. A telecommunications base station comprising the Doherty amplifier of claim 1.

* * * * *